United States Patent [19]

Hato

[11] Patent Number: 5,706,022
[45] Date of Patent: Jan. 6, 1998

[54] OPTICAL DISPLAY DEVICE HAVING AN OPTICALLY TRANSPARENT DRIVER CIRCUIT

[75] Inventor: Tsunehiro Hato, Kawasaki, Japan

[73] Assignee: Fujitsu Limited, Kawasaki, Japan

[21] Appl. No.: 393,679

[22] Filed: Feb. 24, 1995

[30] Foreign Application Priority Data

Mar. 15, 1994 [JP] Japan .................. 6-044470

[51] Int. Cl.⁶ .................................. G09G 3/28
[52] U.S. Cl. .................. 345/92; 345/4; 345/206
[58] Field of Search .................. 345/206, 45, 79, 345/209, 4, 5, 6, 92; 359/53, 59, 66, 85

[56] References Cited

U.S. PATENT DOCUMENTS

| | | |
|---|---|---|
| 5,126,632 | 6/1992 | Parker .................................. 345/4 |
| 5,371,618 | 12/1994 | Tai et al. ............................. 345/4 |
| 5,383,041 | 1/1995 | Yamakazi et al. ................. 345/206 |
| 5,416,494 | 5/1995 | Yokota et al. ........................ 345/4 |

*Primary Examiner*—Victor R. Kostak
*Attorney, Agent, or Firm*—Armstrong, Westerman, Hattori, McLeland & Naughton

[57] ABSTRACT

A display device includes an optically transparent substrate, an optically transparent driver circuit provided on the substrate, and a display element provided on the driver circuit in electrical connection therewith, wherein the display element causes a change in optical state in response to a drive signal supplied from the driver circuit.

18 Claims, 17 Drawing Sheets

OPTICAL DISPLAY DEVICE HAVING AN OPTICALLY TRANSPARENT DRIVER CIRCUIT

BACKGROUND OF THE INVENTION

The present invention generally relates to display devices and more particularly to an optical display device that uses a liquid crystal device or a light emitting device.

Liquid crystal display devices are used extensively for visually displaying information. In the field of information processing apparatuses such as computers, in particular, there is a demand for full-color, high contrast and high speed liquid crystal display devices having wide display area and wide view angle.

In order to meet such a stringent demand, so-called active matrix driving is employed commonly in the art of liquid crystal display wherein a driver circuit is provided in correspondence to each of the pixels such that the transition of the liquid crystal cells is controlled individually by the corresponding driver circuit. Generally, such a drive circuit employs a thin film transistor (TFT) for applying a drive voltage to the individual liquid crystal cells.

FIG. 1 shows an equivalent circuit diagram of a conventional liquid crystal display device of active matrix type, wherein FIG. 1 shows the driver circuits along a cross section of the display device.

Referring to FIG. 1, the liquid crystal display device is formed of a pair of glass substrates (not illustrated) that confines therebetween a liquid crystal layer as usual, wherein the foregoing glass substrates carry a pair of electrodes thereon such that the electrodes face with each other across the liquid crystal layer. The electrodes are formed so as to correspond to the pixels and define a liquid crystal cell designated as "CELL." Further, in order to apply a voltage across the foregoing electrodes and to induce a transition of optical state in the liquid crystal cells, there are provided driver circuits on one of the substrates, wherein FIG. 1 represents the driver circuit by a symbol Tr representing a transistor. Further, the liquid crystal layer is represented in FIG. 1 by a capacitor LC. As noted already, the driver circuit Tr is actually formed of a TFT, and another capacitor C cooperates with the driver circuit Tr in each liquid crystal cell for improving the voltage hold characteristics of the liquid crystal cell.

In such conventional liquid crystal display devices, there exists a problem in that photocarriers tend to be excited in the semiconductor material that forms the TFT when the TFT is subjected to optical radiation. Once excited, the photocarriers may invite erroneous operation of the driver circuit. In order to avoid such an erroneous operation associated with excitation of photocarriers, conventional liquid crystal display devices carry an optical shield SH on the glass substrate in correspondence to the TFTs for protecting the driver circuit from external optical radiation.

On the other hand, the existence of such optical shield SH results in a drawback, particularly in the transmission type liquid crystal display devices that illuminates the liquid crystal layer by a back light, that the luminosity of the display device decreases substantially. It should be noted that this problem of decreasd luminosity is more or less inevitable in active matrix devices even when such an optical shield SH is not provided, as the TFTs forming the driver circuit are generally opaque to visible lights. In the active matrix liquid crystal display devices, it should be noted that such a decrease in the luminosity caused by the optical shield SH is material in view of the fact that the drive circuit is provided in correspondence to each of the liquid crystal cells, which means that the optical shield SH has to be provided in each of the liquid crystal cells.

Another problem pertinent to the conventional liquid crystal display devices is that, because the driver circuits are opaque to visible lights, it has not been possible to stack the drive circuits and the liquid crystal cells with each other. In other words, it has been inevitable to dispose the driver circuits and the liquid crystal cells laterally in the same plane as indicated in FIG. 1, while such a construction has an obvious drawback of increased pixel pitch as compared with the actual size of the electrode that defines the liquid crystal cell. Because of increased pixel pitch, the liquid display device of FIG. 1 is not suitable for high resolution display. Further, it has not been possible to stack the liquid crystal display panels, as such a stacking of the display panels inevitably results in a significant decrease of luminosity.

In relation to the foregoing difficulty in stacking the liquid crystal display panels, there has been a problem in the conventional color liquid crystal display devices that the liquid crystal cells for the three primary colors have to be disposed adjacent with each other in the same plane, while such a construction requires a large area of the glass substrate for a single pixel.

FIG. 2 shows an equivalent circuit diagram of a conventional full-color liquid display device, wherein FIG. 2 corresponds to a cross section of the device similarly to FIG. 1.

Referring to FIG. 2, a single liquid crystal cell corresponding to a single pixel is formed of an assemblage of liquid crystal cells of red, green and blue, wherein it will be noted that a filter FL is provided in addition to the driver circuit Tr and the optical shield SH for each of the liquid crystal cells of red, green and blue. Thereby, the area of the pixel of the display device of FIG. 2 is three times as large as the area of the pixel of the monochrome device of FIG. 1. Further, the use of the filters FL results in a decrease of luminosity to ⅓ of the device of FIG. 1. Thus, conventional full-color liquid display devices needed a specially constructed back light mechanism that minimizes optical loss.

SUMMARY OF THE INVENTION

Accordingly, it is a general object of the present invention to provide a novel and useful display device wherein the foregoing problems are eliminated.

Another and more specific object of the present invention is to provide a display device having an increased luminosity.

Another object of the present invention is to provide a display device suitable for stacking with other display devices.

Another object of the present invention is to provide a display device for visually displaying information, comprising:

an optically transparent substrate;

an optically transparent driver circuit provided on said substrate; and a display element provided on said driver circuit in electrical connection therewith, said display element causing a change in optical state in response to a drive signal supplied from said driver circuit.

Another object of the present invention is to provide a display device for visually displaying information, comprising:

a plurality of display panels stacked with each other, each of said plurality of display panels comprising: an optically transparent substrate; an optically transparent driver circuit provided on said substrate; and a display element provided on said driver circuit in electrical connection therewith, said display element causing a change in optical state in response to a drive signal supplied from said driver circuit.

According to the present invention, the problem pertinent to the conventional display device that the driver circuit of the display device interrupts the light passing through the display device, is effectively eliminated by constructing the driver circuit from an optically transparent material. Particularly, it is advantageous to use a dielectric material having a large bandgap for the active part of the device that forms the driver circuit. By using such an optically transparent wide gap material for the driver circuit, it is possible to eliminate the erroneous operation of the driver circuit even when the driver circuit is subjected to optical irradiation, and one can eliminate the optical shield that has been used conventionally for shielding the driver circuit optically. For example, one may use a dielectric base bipolar transistor for the transparent driver circuit. As a result of use of such a transparent driver circuit, the optical loss of the display device is substantially reduced and the luminosity of the device is increased accordingly.

It should be noted that the operation of the display device of the present invention is not substantially influenced even when the transparent driver circuit is provided so as to intersect the path of the optical beam that passes through the display device. Thus, it is possible to provide a redundant driver circuit in addition to the primary driver circuit, without causing any substantial decrease in the amount of light beam passing through the display device. Thereby, the reliability of the display device is improved due to increased redundancy. The present invention is particularly useful in constructing a liquid crystal display device or a display device that uses light emitting elements.

In the present invention that employs a transparent driver circuit which is immune to optical excitation of photocarriers, it is possible to construct a display device by stacking a plurality of display panels each including a display element and a driver circuit formed on a substrate. In such a multi-layer display device, the light passes the plurality of panels consecutively. Thus, by providing three primary colors for three different layers respectively, it is possible to construct a full-color display device. As the pixels of three primary colors are aligned vertically in such a full-color display device, it is no longer necessary to arrange the liquid crystal cells of the three primary colors laterally as in the device of FIG. 2, and the area of each pixel is substantially reduced. Associated therewith, the dot pitch of display is also reduced and a high resolution display is obtained.

By stacking such display panels with each other, it is also possible to construct a three-dimensional display device that displays information in a three-dimensional space. For example, one may stack a number of disk-shaped panels to form a spherical display device. Alternatively, one may stack cylindrical or spherical shells of display panels to form a spherical or cylindrical three-dimensional display device. As each shells are transparent in the present invention, it is possible to provide a back light by disposing a single light source at the center of such a display device.

Other objects and further features of the present invention will become apparent from the following detailed description when read in conjunction with attached drawings.

DETAILED DESCRIPTION OF PREFERRED EMBODIMENTS

First, prior art technology that forms the background of the present invention will be reviewed briefly.

Figure 1:
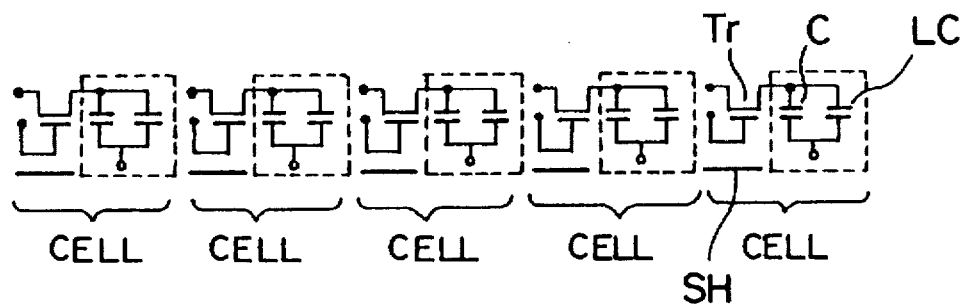
FIG. 1 is a diagram showing the construction of a conventional liquid crystal display device.
Figure 2:
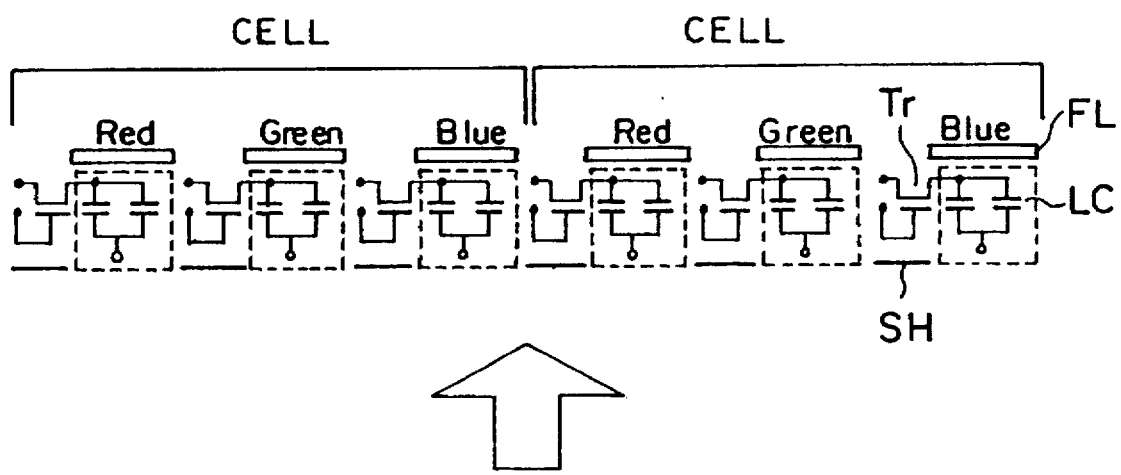
FIG. 2 is a diagram showing the construction of a conventional full-color liquid crystal display device.
Figure 3:
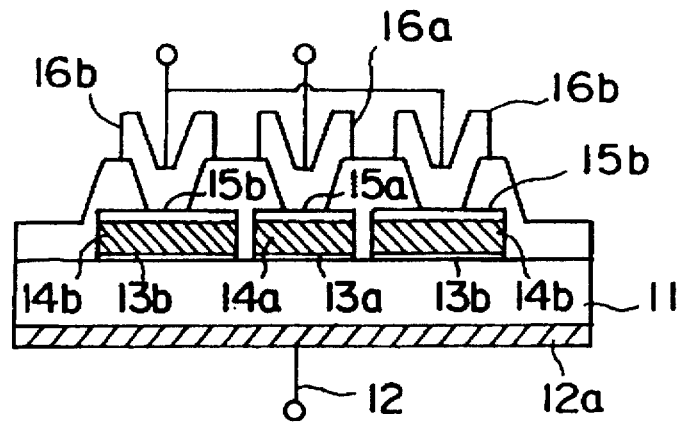
FIG. 3 is a diagram showing the construction of a conventional dielectric base transistor.

FIG. 3 shows the construction of a dielectric base transistor proposed previously.

Referring to FIG. 3, the dielectric base transistor is constructed on a dielectric substrate 11 that acts as a base of the transistor. The substrate 11 is typically formed of $SrTiO_3$ doped to the n-type, and a base electrode 12 is provided on the lower major surface of the substrate 11 by means of a silver paste layer 12a. On the upper major surface of the substrate 12, there are provided thin MgO patterns 13a and 13b in correspondence to the emitter and collector, wherein the MgO pattern 13a carries thereon an emitter layer 14a of $YBa_2Cu_3O_{7-x}$, a typical high temperature superconductor known as YBCO. Similarly the MgO pattern 13b carries thereon a collector layer 14b of YBCO. It should be noted that an emitter electrode 16a is provided on the emitter layer 14a via an intervening Au layer 15a, while a collector electrode 16b is provided on the collector layer 14b via an intervening Au layer 15b.

It should be noted that the dielectric base 11 of $SrTiO_3$ is characterized by a very large dielectric constant, while the MgO patterns 13a and 13b have a much larger bandgap as compared with $SrTiO_3$. Thus, the MgO patterns 13a and 13b act as a barrier layer and prevents the electrons from flowing from the emitter layer 14a to the collector layer 14b in the normal, unbiased state of the device.

When a base voltage is applied to the base electrode 12, on the other hand, an electrostatic induction occurs in the dielectric base 11 that has a very large dielectric constant, and the electrostatic induction thus induced causes a deformation in the potential barrier formed by the MgO patterns 13a and 13b. Thereby, injection of electrons occurs from the emitter layer 14a to the conduction band of the base 11 by causing a tunneling through the deformed potential barrier. The electrons thus injected are then transported along the conduction band by drifting and reach the other MgO pattern 13b. The electrons then penetrate through the deformed potential of the MgO pattern 13b and reach the collector layer 14b. A more detailed description of dielectric base transistor can be found in the U.S. Pat. No. 5,291,274, which is incorporated herein as reference. Further, reference should also be made to H. Tamura, A Yoshida, H. Takauchi, T. Hato, N. Yokoyama, 12TH SYMPOSIUM ON FUTURE ELECTRON DEVICES, Oct. 12–13, 1993, Tokyo, pp. 61–66.

In the dielectric base transistor having such a construction, it should be noted that no substantial excitation of photocarriers occurs even when the transistor is subjected to optical illumination, as $SrTiO_3$ that forms the base 11 has a bandgap of as much as 3.3 meV. This holds even more true in the barrier layers 13a and 13b that have a much larger bandgap. Similarly, no substantial excitation of photocarriers occurs in the emitter layer 14a or collector layer 14b formed of YBCO. In other words, the operation of the dielectric base transistor of FIG. 3 is immune to optical radiation applied thereto.

Figure 4:
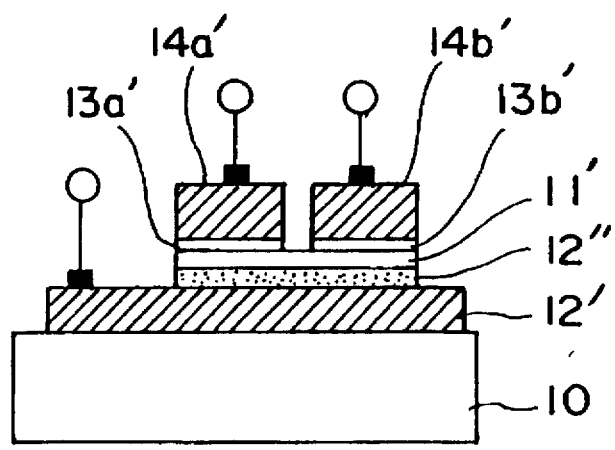
FIG. 4 is a diagram showing the construction of another conventional dielectric base transistor.

FIG. 4 shows a modification of the dielectric base transistor of FIG. 3, which is also proposed previously.

Referring to FIG. 4, the transistor includes a superconducting base electrode 12' of YBCO provided on a suitable substrate 10, wherein the base electrode 12' carries thereon a $CeO_2$ layer 12", while the $CeO_2$ layer 12" carries thereon a base layer 11' of $SrTiO_3$. The base layer 11' in turn carries MgO patterns 13a' and 13b' respectively corresponding to the MgO patterns 13a and 13b, wherein the MgO pattern 13a' carries an emitter layer 14a' of YBCO while the MgO pattern 13b' carries a collector layer 14b' also of YBCO.

Figure 5:
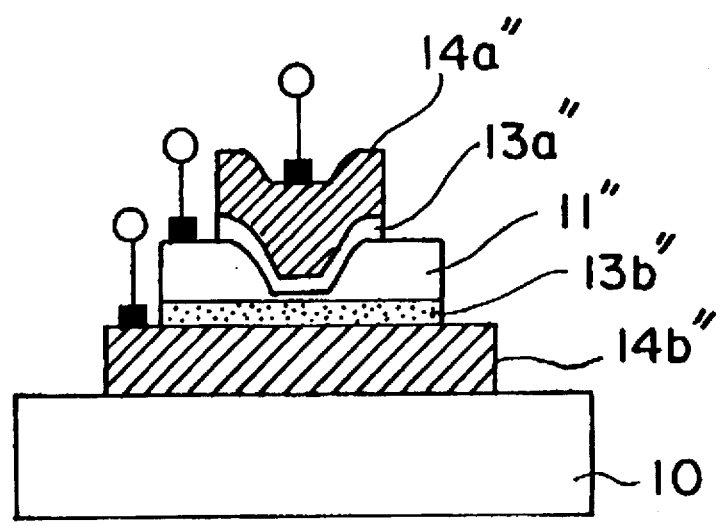
FIG. 5 shows the construction of another dielectric base transistor.

FIG. 5 shows a still another modification of the dielectric base transistor of FIG. 3, which is also proposed previously.

Referring to FIG. 5, the transistor is constructed on a substrate corresponding to the substrate 10 and includes a superconducting collector layer 14b" of YBCO provided on the substrate 10, a collector barrier layer 13b" of MgO provided on the foregoing collector layer 14b", a dielectric base 11" of $SrTiO_3$ provided on the foregoing barrier layer 13b", an emitter barrier layer 13a" of MgO provided on the foregoing dielectric base 11", and an emitter layer 14a" of YBCO provided on the foregoing emitter barrier layer 13a". In the transistor of FIG. 5, it should be noted that the dielectric base 11 includes a region of reduced thickness between the collector layer 13b" and the emitter layer 13a" for facilitating the transit of carriers therethrough.

As described already, such dielectric base transistors have the active part formed of dielectric material that is optically transparent. Thus, by using such a dielectric base transistor, it is possible to construct an optical display device having an optically transparent driver circuit. It should be noted that such optically transparent driver circuit is capable of driving any of optical modulation devices such as a liquid crystal device or light emitting devices such as a light emitting diode.

Figure 6:
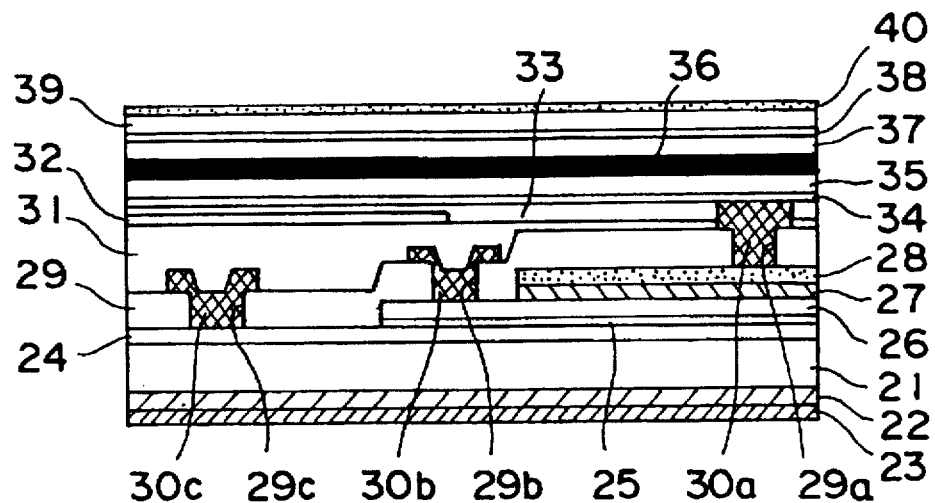
FIG. 6 is a cross sectional diagram showing part of the display device according to a first embodiment of the present invention.

Hereinafter, a first embodiment of the present invention will be described with reference to FIG. 6 showing a part of a liquid crystal display device in an enlarged scale. It should be noted that FIG. 6 shows one of the liquid crystal cells corresponding to a single pixel in a cross sectional view.

Referring to FIG. 6, the liquid crystal display device is formed on a glass substrate 21 that carries a phase plate 22 and a polarizer 23 on a lower major surface thereof, wherein the glass substrate 21 further carries a collector layer 24 of ITO ($In_2O_3 \cdot SnO_2$) on an upper major surface thereof, and a barrier layer 25 of MgO and a base layer 26 of $SrTiO_3$ are deposited consecutively on a part of the collector layer 24, while the base layer 26 in turn carries another barrier layer 27 of MgO and an emitter layer 28 of ITO. Further, the layered structure formed of the layers 24–28 is covered by an insulation film 29 of $SiO_2$, wherein the insulation film 29 is formed with a contact hole 29a that exposes the emitter layer 28, a contact hole 29b that exposes the base layer 26, and a contact hole 29c that exposes the collector layer 29. Further, the contact holes 29a–29c are filled with transparent electrode patterns 30a, 30b and 30c of ITO respectively. Thereby a dielectric base transistor similar to the one described with reference to FIGS. 3–5 is formed except that the electrodes are replaced from YBCO to ITO.

The dielectric base transistor thus formed is covered by a planarization layer 31 of SOG and the like, wherein a transparent electrode pattern 32 of ITO is provided on the planarization layer 31 so as to cover the collector electrode 30c and the base electrode 30b. Further, the foregoing transparent electrode pattern 32 is covered by another planarization layer 33 of SOG, and the like. It should be noted that the contact hole 29a penetrates through the planarization layers 31 and 33, and the emitter electrode 30a filling the contact hole 29a is exposed on the surface of the planarization layer 33.

On the planarization layer 33, another transparent electrode pattern 34 of ITO is provided in correspondence to the foregoing liquid crystal cell. The transparent electrode pattern 34 is separated from other corresponding transparent electrode patterns of adjacent liquid crystal cells and is formed so as to cover the dielectric base transistor when viewed in the direction perpendicular to the substrate 21.

On the transparent electrode pattern 34, there is formed a first molecular alignment film 35, which is typically formed of a rubbed polyimide film, and a liquid crystal layer 36 is provided on such a molecular alignment film 35. Further, another molecular alignment film 37, also of a rubbed polyimide film, is provided on the liquid crystal layer 36, wherein the molecular alignment film 37 is provided on a transparent common electrode layer 38 of ITO which is provided on a lower major surface of another glass substrate 39, and the glass substrate 39 is so disposed that the liquid crystal layer 36 is confined between the molecular alignment film 37 and the molecular alignment film 35. It should be noted that the glass substrate 39 carries a second polarizer 40 on an upper major surface thereof. Further, a similar construction is provided for each of the liquid crystal cells.

In operation, a light beam produced by a back light source not illustrated impinges upon the glass substrate 21 after passing through the polarizer 23 and phase plate 22, wherein the light beam thus impinged to the substrate 21 reach the liquid crystal layer 36 without experiencing substantial absorption by the dielectric base transistor as well as by the insulator layers that surround the dielectric base transistor. The liquid crystal layer 36 includes liquid crystal molecules of which molecular orientation is restricted by the first and second molecular alignment films 35 and 37 as usual, and the orientation of the liquid crystal molecules is changed in response to the electric voltage applied across the foregoing transparent electrodes 34 and 38. In other words, the liquid crystal layer 36 changes the optical state in response to the voltage obtained at the emitter electrode 30a of the dielectric base transistor, and the liquid crystal cell turns on and turns off the impinged light beam accordingly.

It should be noted that such a transition of the optical state of the liquid crystal layer 36 occurs in response to the signal supplied to the base electrode 30a of the dielectric base transistor. In other words, the dielectric base transistor forms the driver circuit in the liquid crystal cell of FIG. 6. In the driver circuit, it should be noted that the electrodes 31 and 34 form a capacitor for stabilizing the voltage applied to the liquid crystal layer 36.

Figure 7:
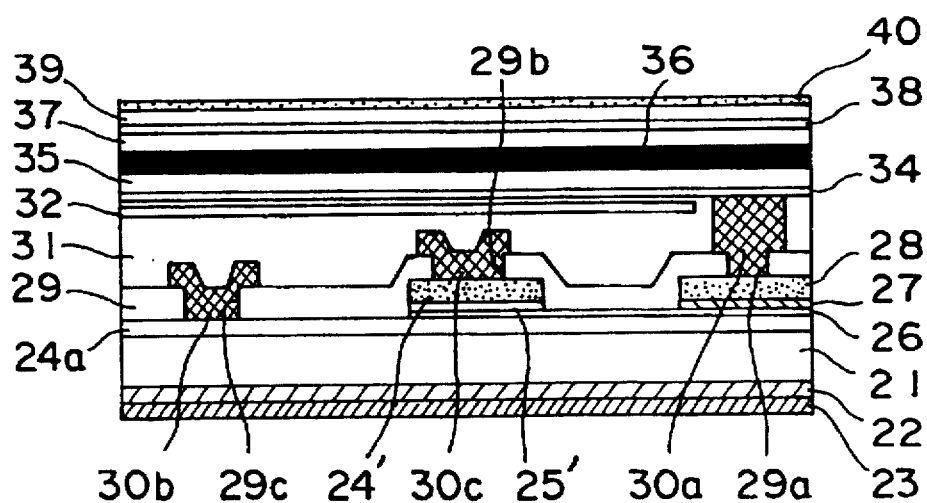
FIG. 7 is a cross sectional diagram showing a modification of the first embodiment of the present invention.

FIG. 7 shows a modification of the liquid crystal cell of FIG. 6, wherein those parts corresponding to FIG. 6 are designated by the same reference numerals.

In the construction of FIG. 7, an ITO layer 24a is formed on the glass substrate 21 as a base contact, and the base electrode 30b is now formed in the contact hole 29c such that the base electrode 30b is connected to the base layer 26 of SrTiO$_3$ via the base contact layer 24a. On the other hand, it will be noted that the collector electrode 30c is formed in correspondence to the contact hole 29b, and a barrier layer 25' of MgO as well as a collector contact layer 24' are formed in correspondence to the collector electrode 30c thus formed. In such a construction, too, it is possible to form a transparent driver circuit on the substrate 21 for driving the liquid crystal layer 36.

Figure 8:
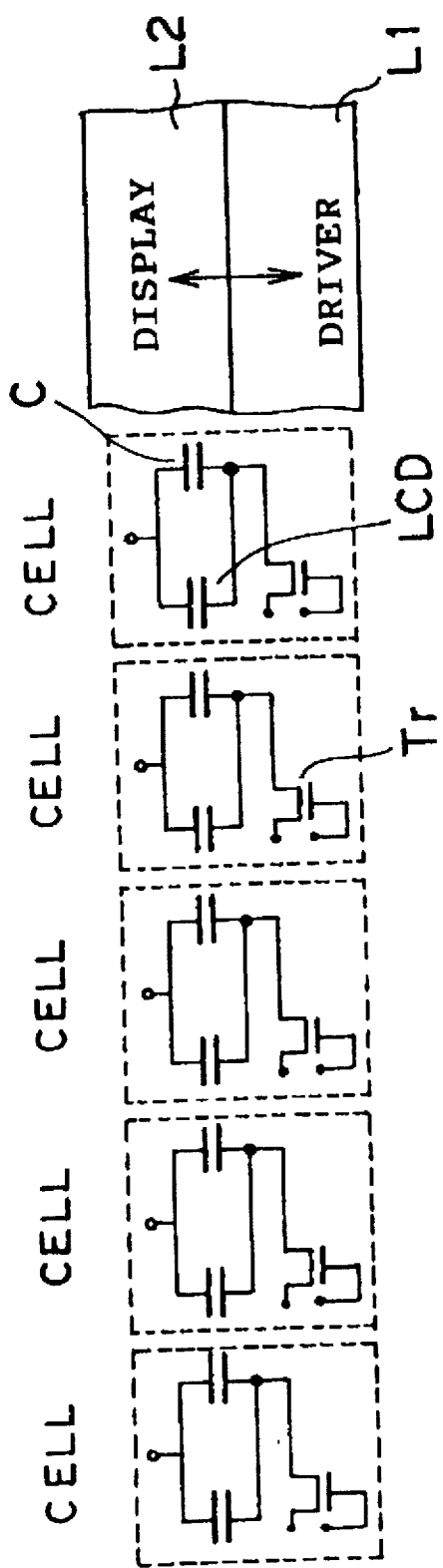
FIG. 8 is an equivalent circuit diagram of the display device of the first embodiment taken along a cross section thereof.

It should be noted that the liquid crystal cells shown in FIG. 6 or FIG. 7 are disposed in rows and columns on the glass substrate 21 to form a liquid crystal display device. FIG. 8 shows such an array of the liquid crystal cells in the form of the equivalent circuit diagram, wherein it will be noted that the equivalent circuit diagram of FIG. 8 corresponds to a cross section indicated at the right side of FIG. 8. In the circuit diagram of FIG. 8, it should be noted that the liquid crystal layer 36 including the electrodes 34 and 38 as well as the molecular alignment films 35 and 37 is designated by a symbol LCD, while the stabilization capacitor formed of the electrode layers 32 and 34 is designated by a symbol C. Thereby, the liquid crystal layer LCD and the capacitor C form a liquid crystal device element.

Referring to FIG. 8, it will be noted that each liquid crystal cell is formed of a driver layer L1 that includes a substrate and a dielectric base transistor Tr formed thereon, wherein a display layer L2 formed of a liquid crystal device element is provided on the driver layer L1 such that the capacitor 34 that defines the liquid crystal cell covers the dielectric base transistor when viewed in the direction perpendicular to the substrate. In FIG. 8, the broken line surrounding each liquid crystal cell indicates that the capacitor 34 of the liquid crystal cell covers the dielectric base transistor underneath in correspondence to the structure of FIG. 6 or FIG. 7.

Figure 9:
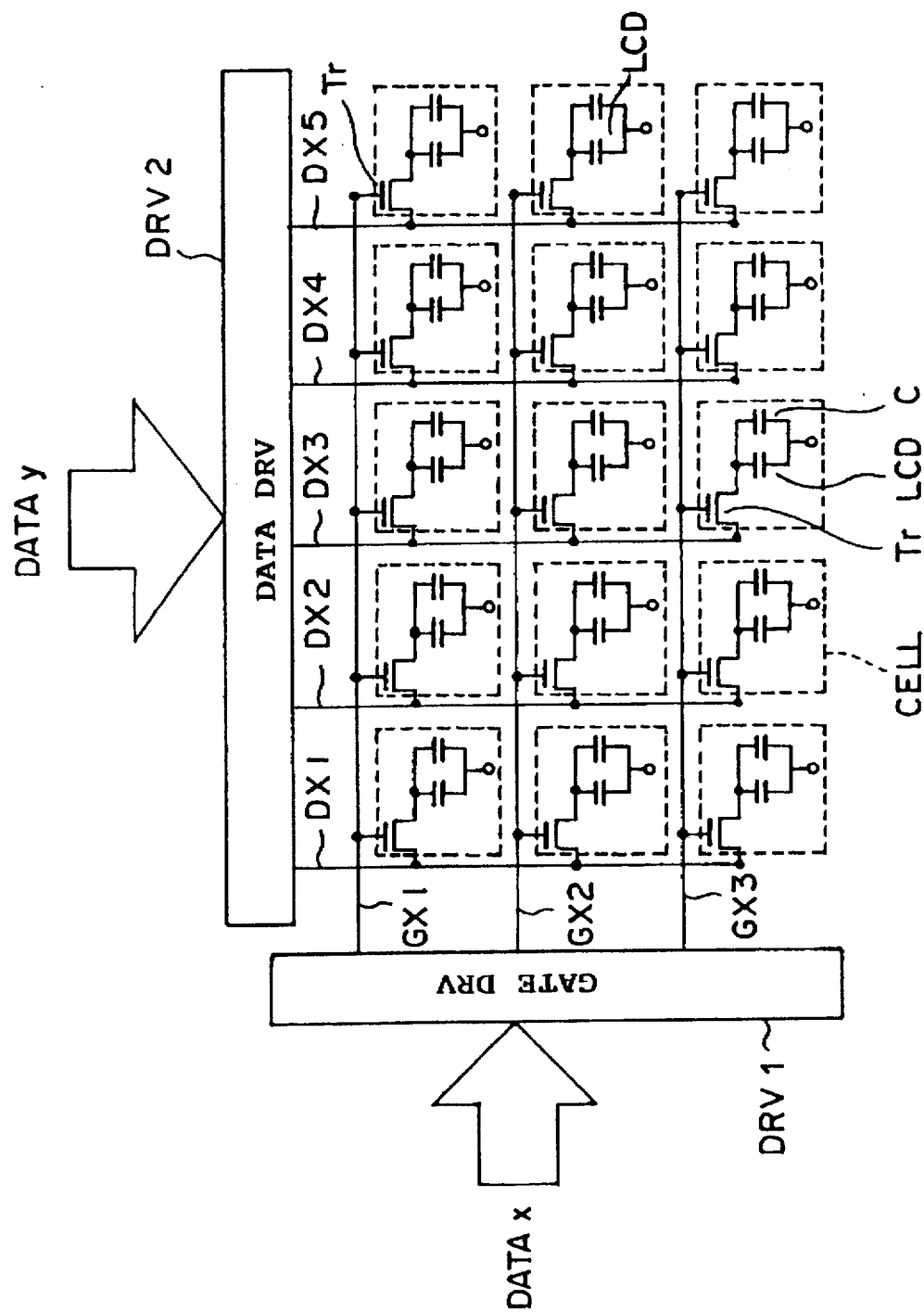
FIG. 9 is an equivalent circuit diagram corresponding to a plan view of the display device of the first embodiment.

By disposing the liquid crystal cells in row and columns as indicated in FIG. 9, it is possible to obtain a liquid crystal display device for two-dimensional display of images.

Referring to FIG. 9, the liquid crystal display device is formed of a row and column formation of the liquid crystal cells of FIG. 8, and includes a plurality of data lines $DX_1$–$DX_5$ each extending in the row direction and connected to the collector electrode (electrode 30c of FIGS. 6 and 7) of a corresponding dielectric base transistor, and a plurality of gate lines $GX_1$–$GX_3$ each extending in the row direction and connected to the base electrode (electrode 30b of FIGS. 6 and 7) of a corresponding dielectric base transistor. Further, a first decoder DRV1 supplied with display data DATAx for selectively activating the gate lines $GX_1$–$GX_3$ and a second decoder DRV2 supplied with display data DATAy for selectively activating the data lines $DX_1$–$DX_5$ cooperate with the liquid crystal display device.

In the display device of the present embodiment, one can use materials other than ITO for the transparent electrode. For example, one may use $TiO_2$, $SnO_2$, $In_2O_3$, and the like, for this purpose. Further, it is possible to form optically transparent resistors from such transparent conductors. Further, it is possible to use optical modulating elements other than liquid crystal device such as electrochromic device for the display device of the present invention.

Next, a second embodiment of the present invention will be described with reference to FIGS. 10 and 11.

It should be noted that the optically transparent driver circuit of the present invention that uses dielectric base transistor is not only useful in the display devices that use the optical modulating elements such as liquid crystal devices but also in the display devices that use light emitting devices. FIGS. 10 and 11 show an example in which light emitting diodes (LEDs) are used for such light emitting devices. It should be noted that the construction of FIG. 10 generally corresponds to the construction of FIG. 8 described already, while the construction of FIG. 11 generally corresponds to the construction of FIG. 9. Thus, those parts described previously are designated by the same reference numerals and the description thereof will be omitted.

Figure 10:
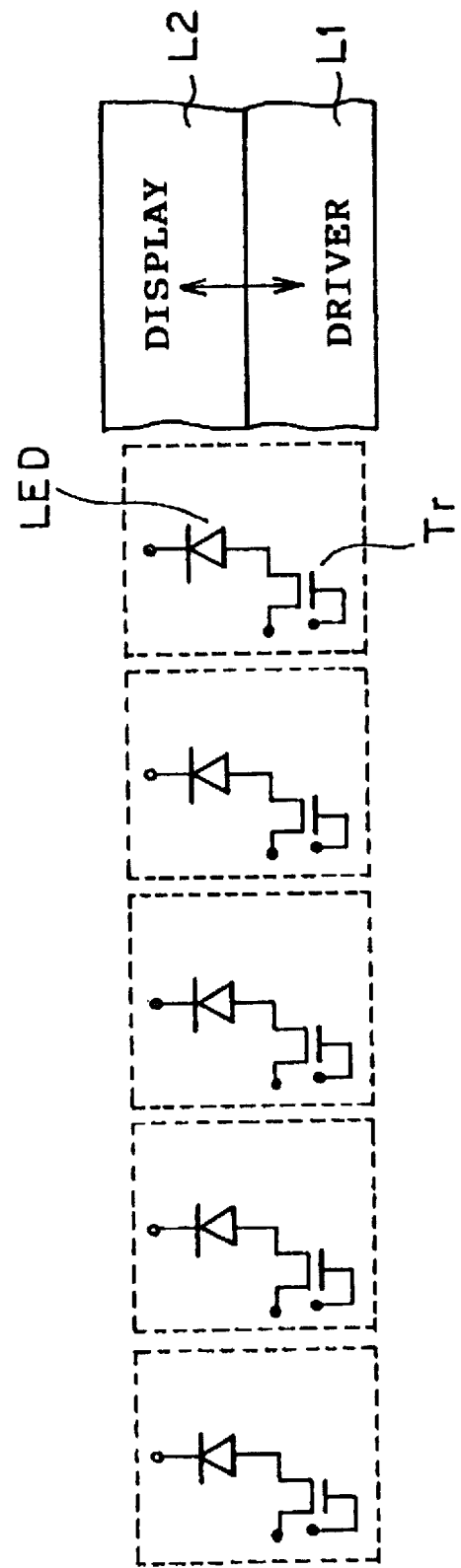
FIG. 10 is an equivalent circuit diagram of the display device according to a second embodiment of the present invention, taken along a cross section thereof.
Figure 11:
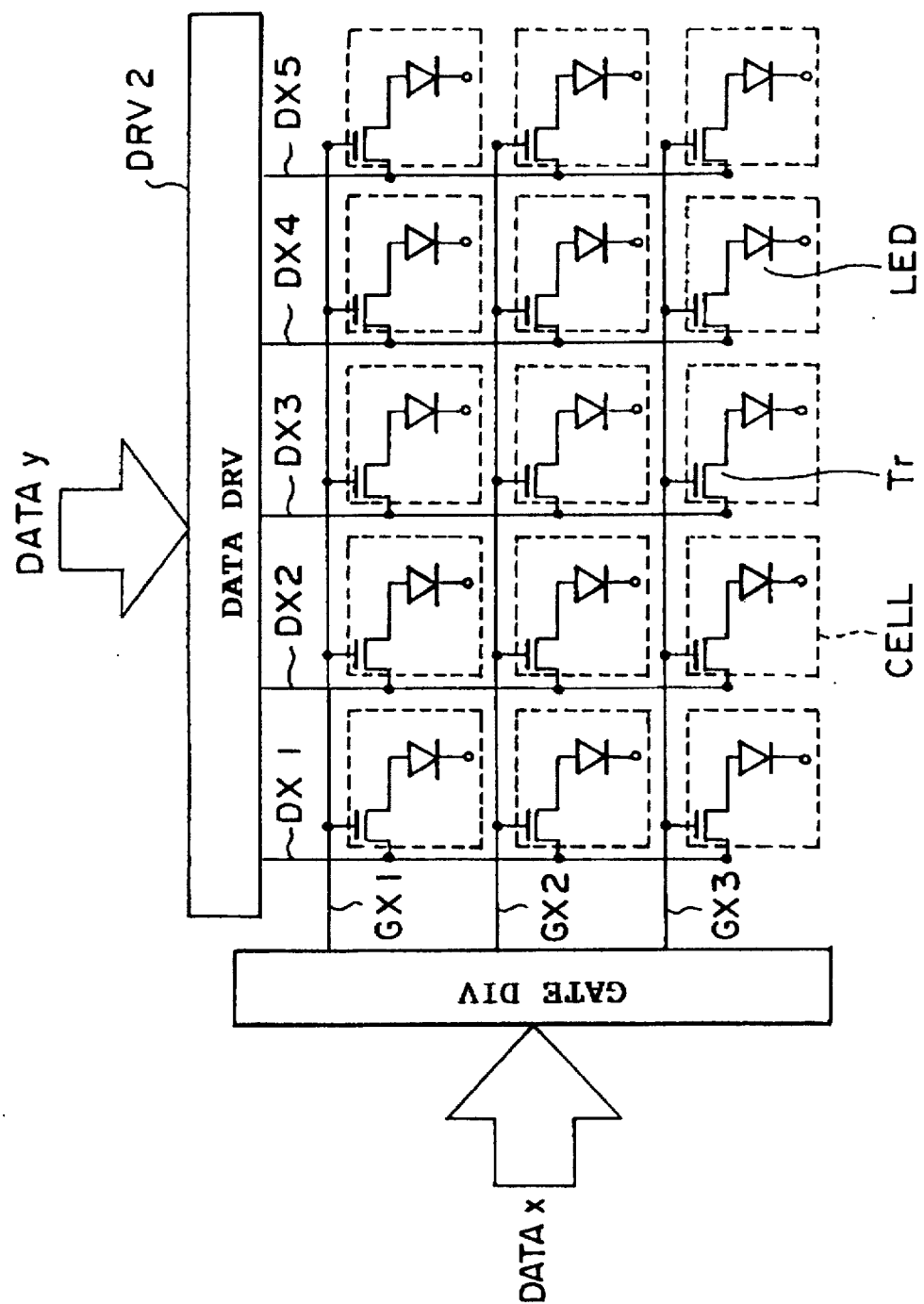
FIG. 11 is an equivalent circuit diagram corresponding to a plan view of the display device of the second embodiment.
Figure 12:
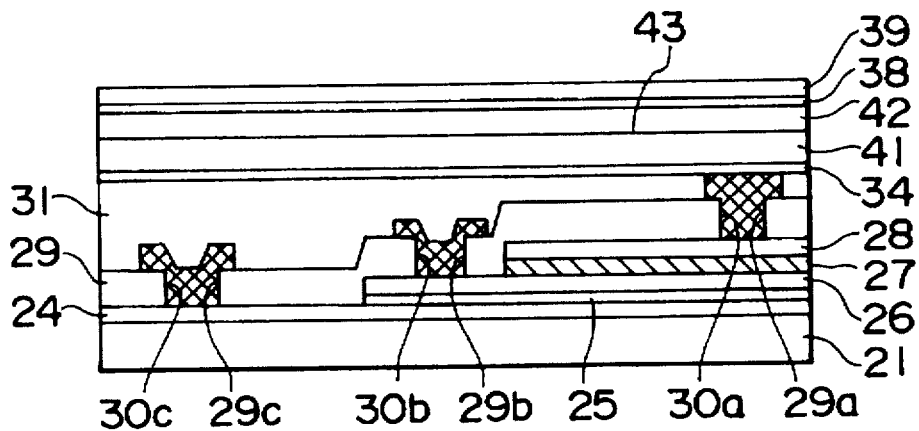
FIG. 12 is a cross sectional view showing part of the second embodiment of the present invention.

FIG. 12 shows the construction of a single display cell in the device of FIG. 10 or FIG. 11 in an enlarged scale, wherein FIG. 12 shows a structure that uses an LED for producing red or green colors.

Referring to FIG. 12, the dielectric base transistor forming the driver circuit has a construction generally identical to that of FIG. 6 except that an n-type layer 41 forming a part of an LED is provided on the transparent electrode 34 that defines the display cell and a p-type layer 42 is formed on the n-type layer 41. Thereby, a p-n junction 43 is formed between the n-type layer 41 and the p-type layer 42. Further, the transparent electrode 38 on the lower major surface of the glass substrate 39 is provided on the layer 42. Thus, there occurs a spontaneous emission of light at the p-n junction 43. In the display cell of FIG. 12, it should be noted that the polarizers 23 and 40, the phase plate 40, the liquid crystal layer 36 and the molecular alignment films 35 and 37 are not provided, in contrast to the liquid crystal cell of FIG. 6 or FIG. 7. In the LED in the display cell of FIG. 12, the layers 41 and 42 may be formed of GaAlAs when it is desired to obtain a red color beam, while when a green color beam is desired, the layers 41 and 42 may be formed of GaP.

Figure 13:
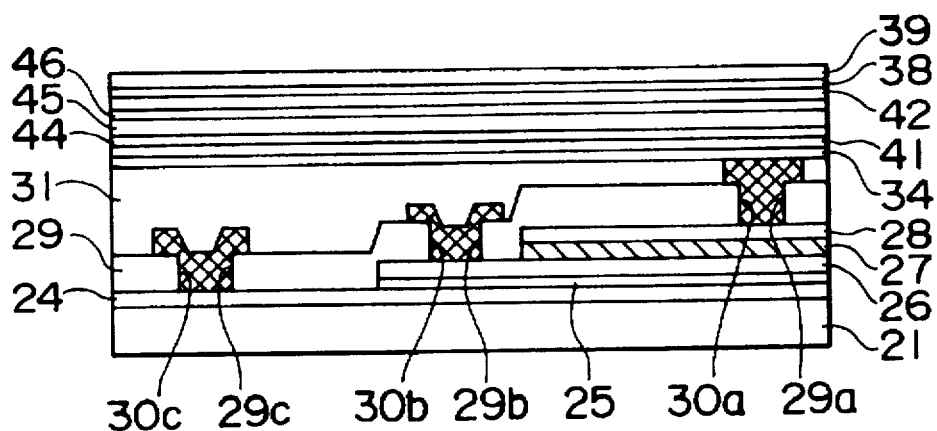
FIG. 13 is a cross sectional view showing another construction of the second embodiment of the present invention.

FIG. 13 shows the construction of the display cell that emits a blue color beam.

Referring to FIG. 13, the LED that produces a blue color beam in the display cell uses n-type GaN for the layer 41 on which a layer 44 of n-type AlGaN and a layer 45 of Zn-doped InGaN are deposited consecutively. Further, a layer 46 of p-type AlGaN is formed on the layer 45 and a p-type GaN layer is formed on the layer 46 as the layer 42.

In any of the structures of FIGS. 12 and 13, each semiconductor layer forming the LED has a very small thickness and is substantially transparent to visible lights. It should be noted that the display device using such an LED can be formed by depositing the semiconductor layers 41, 43 and 42 consecutively on the electrode pattern 34, or alternatively by bonding an LED chip on the electrode layer 38 provided on the glass substrate 39 and by bonding such a substrate 39 upon the glass substrate 21 that carries the electrode 34.

Figure 14:
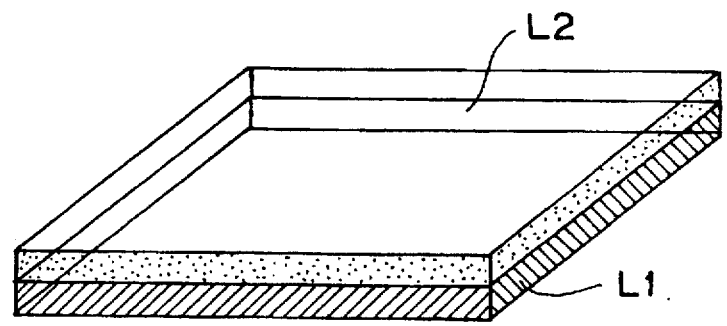
FIG. 14 is a perspective view showing a two-dimensional display device according to the first or second embodiment of the present invention.
Figure 15:
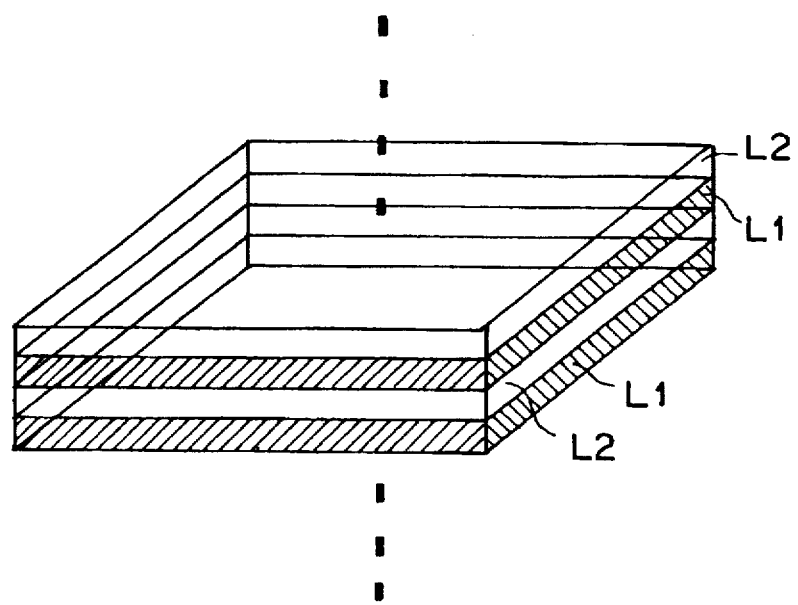
FIG. 15 is a diagram showing a display device in which the two-dimensional display device of FIG. 14 is stacked a number of times.

FIG. 14 shows, in a perspective view, a display device formed by arranging the display cells of the first or second embodiment described previously in a row and column formation. It should be noted that such a display device is formed by stacking the driver layer $L_1$ and the display layer $L_2$ shown in FIG. 8 or FIG. 9 with each other and is transparent to the visible lights. Thus, it is possible to view the displayed information form both sides of the device. Further, it is possible to project the displayed image on a screen like an overhead projector by illuminating the displayed image by an external light source. Further, by stacking the display device of FIG. 14 a number of times as indicated in FIG. 15, it is possible to synthesize various visual information spatially.

Figure 16:
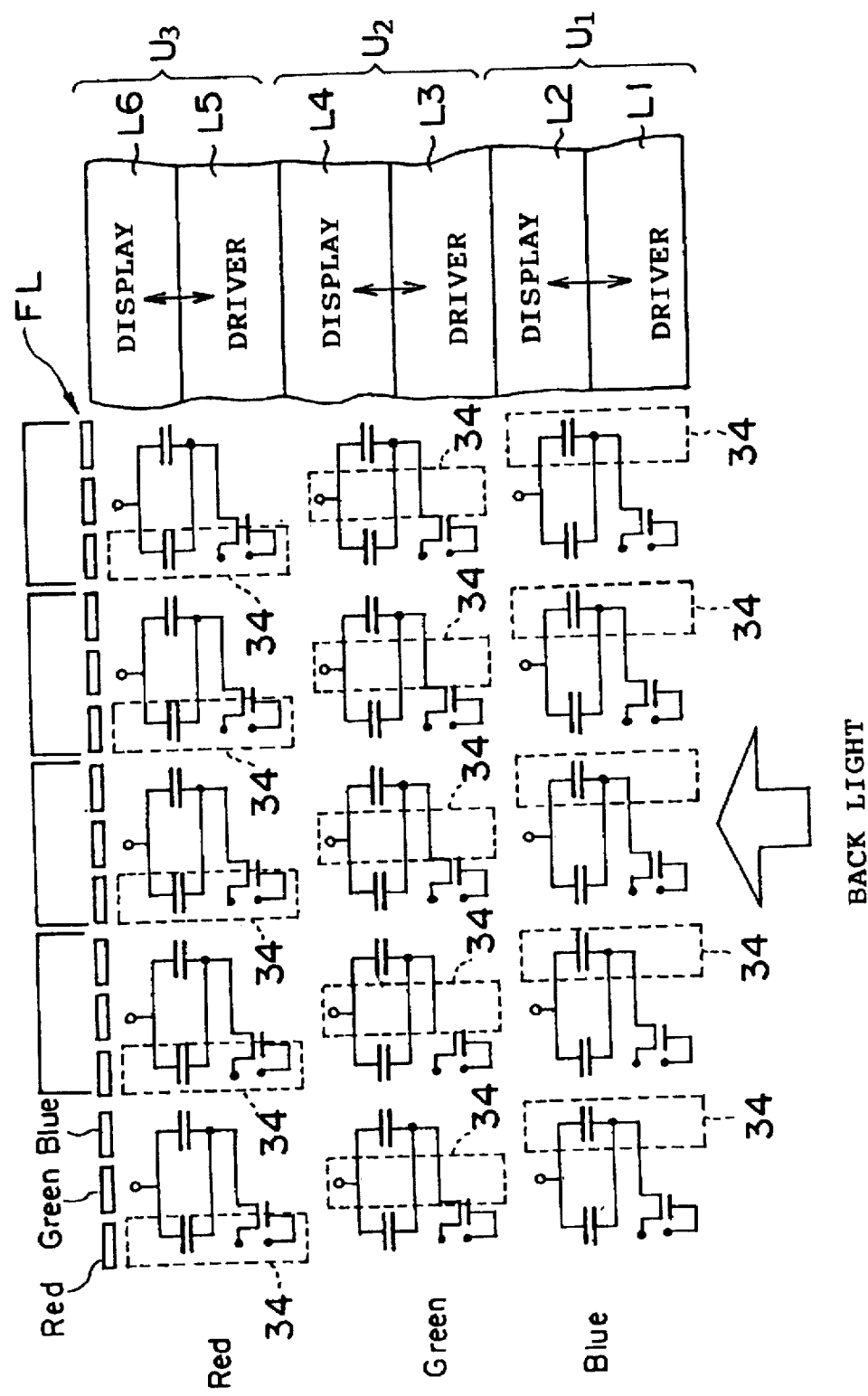
FIG. 16 is an equivalent circuit diagram of a full-color display device taken along a cross section thereof.

FIG. 16 shows the construction of a full-color display device according to a third embodiment of the present invention, wherein the display device of the present invention is obtained by stacking the device of FIG. 14 three times.

Referring to FIG. 16, the full-color display device is formed of an alternate stacking of the driver layers $L_1$, $L_3$ and $L_5$ and the display layers $L_2$, $L_4$ and $L_6$, wherein the layers $L_1$ and $L_2$ are stacked with each other to form a first display layer unit $U_1$ for blue, the layers $L_3$ and $L_4$ are stacked with each other to form a second display layer unit $U_2$ for green, and the layers $L_5$ and $L_6$ are stacked with each other to form a third display layer unit $U_3$ for red. It should be noted that the back light is irradiated upon the lower major surface of the layer unit $U_1$ and travels consecutively through the layer units $U_1$–$U_3$, wherein the layer units $U_1$–$U_3$ are so disposed that the display cells overlap in the traveling direction of the back light beam.

In each cell of FIG. 16, it should be noted that the display device occupies only a part of the cell. Thus, the transparent electrode 34 is formed on a predetermined position in each cell, wherein the foregoing predetermined position is identical in the cells included in the same layer unit. On the other hand, the foregoing predetermined position changes in the cells that belong to different layer units.

In FIG. 16, it should be noted that the broken line indicates the position of the transparent electrode 34 in each liquid crystal cell. As will be noted from FIG. 16, the electrode 34 for the layer unit $U_1$ is provided with a positional shift with respect to the electrode 34 for the layer unit $U_2$. Similarly, the electrode 34 for the layer unit $U_2$ is provided with a positional shift with respect to the electrode 34 for the layer unit $U_3$. Further, there are provided color filters FL on the upper major surface of the layer unit $U_3$ wherein the color filters FL include filter elements of blue, green and red, which filter elements being disposed in correspondence to the electrode 34 for the respective colors.

In the full-color display device having such a construction, the image formed in the layer unit $U_1$ in correspondence to the electrode 34 is colored blue by the blue filter element. Similarly, the image formed in the layer unit $U_2$ in correspondence to the electrode 34 is colored green by the green filter element. Further, the image formed in the layer unit $U_3$ in correspondence to the electrode 34 is colored red by the red filter element. The display device of FIG. 16 produces a full-color image as a result of synthesis of such images of the three primary colors.

Figure 17:
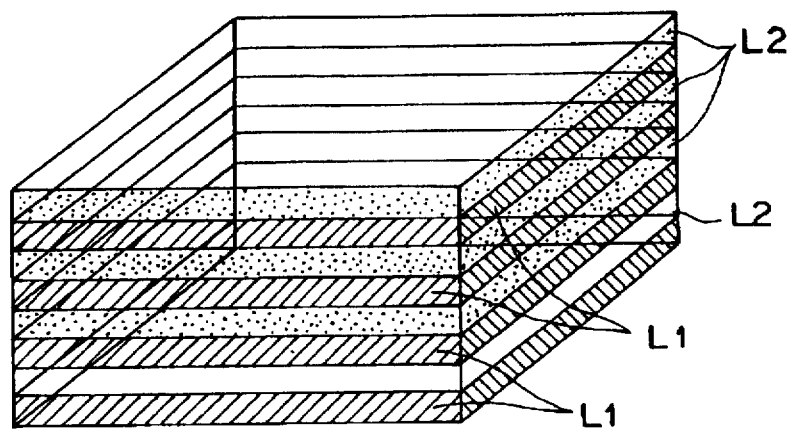
FIG. 17 is a perspective diagram showing a construction of the three-dimensional display device formed by stacking a number of two-dimensional display devices.

Further, by stacking the display devices according to any of the first through third embodiments, it is possible to construct a three-dimensional display device shown in FIG. 17. As the driver circuits are transparent in the present invention, it is possible to recognize the image displayed in the lower layer units even when a large number of layer units are stacked thereon.

Figure 18:
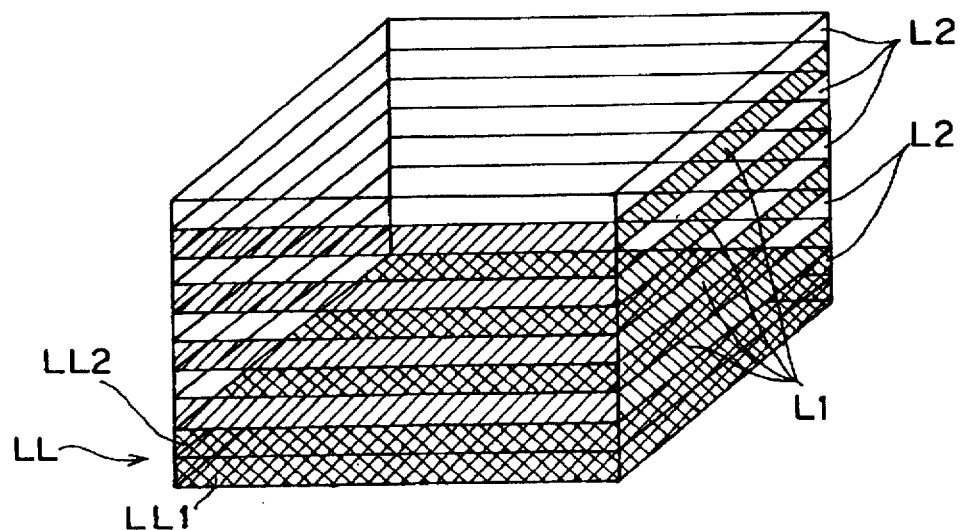
FIG. 18 is a perspective diagram showing a construction of the three-dimensional display device equipped with a back light.

FIG. 18 shows an example wherein a back light LL is formed under the three dimensional display device of FIG. 17 in the form of plasma display or LED array.

Referring to FIG. 18, the back light LL is formed of a support substrate LL1 that carries thereon a driver circuit and an LED array $LL_2$ provided on the support substrate LL1, wherein the LED array $LL_2$ may include a two-dimensional array of LEDs arranged in correspondence to the two-dimensional array of the liquid crystal cells in the layers L1 and L2. Alternatively, one may employ any other planar back light that has a two-dimensional light emitting surface.

Figure 19:
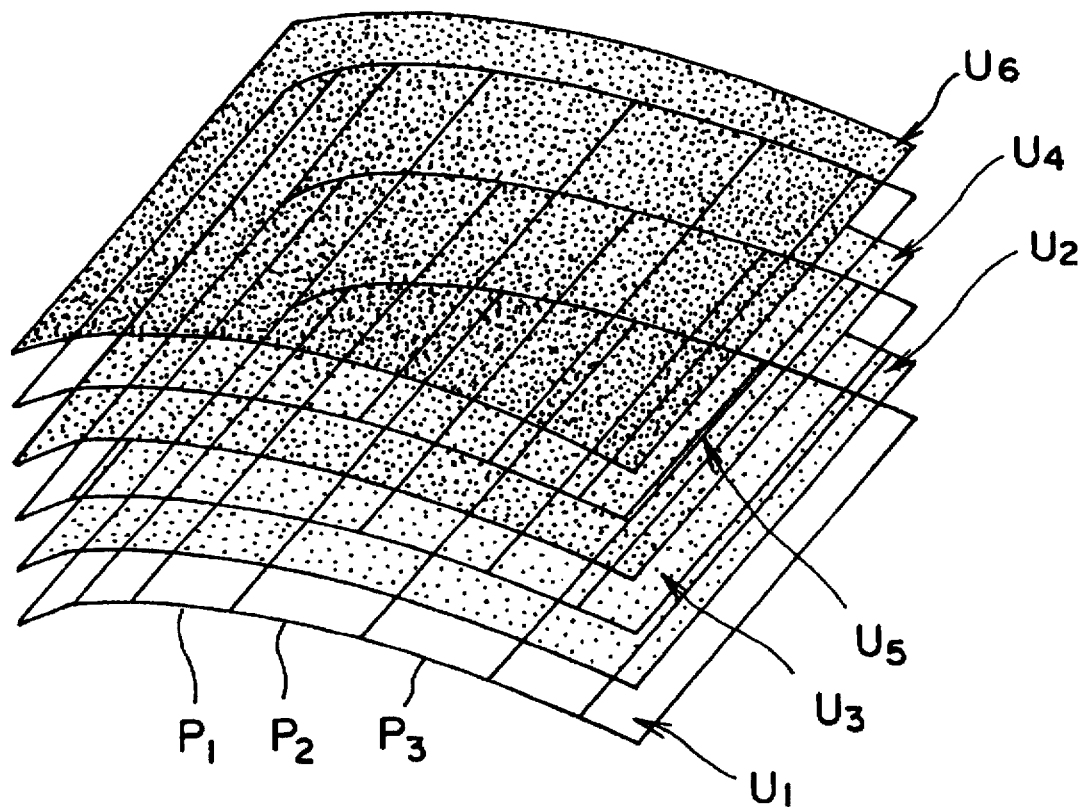
FIG. 19 is a perspective diagram showing a construction of the three-dimensional display device formed by stacking a number of two-dimensional display devices each having a curved surface.

FIG. 19 shows an embodiment for constructing a three-dimensional display device characterized by a curved surface by stacking the two-dimensional display devices of FIG. 15 a number of times.

Referring to FIG. 19, the display device of the present invention is formed by arranging a number of transparent display layers $P_1$, $P_2$, $P_3$, . . . each corresponding to the display device of FIG. 15 with a mutually inclined relationship to form the layer units $U_1$, $U_2$, . . . with a curved surface. Further, by stacking such a curved layer units $U_1$–$U_6$, it is possible to construct a three-dimensional display device having a curved surface. It is also possible to construct a full-color three-dimensional display device having a curved surface by providing the layer units in correspondence to the three primary colors.

Figure 20:
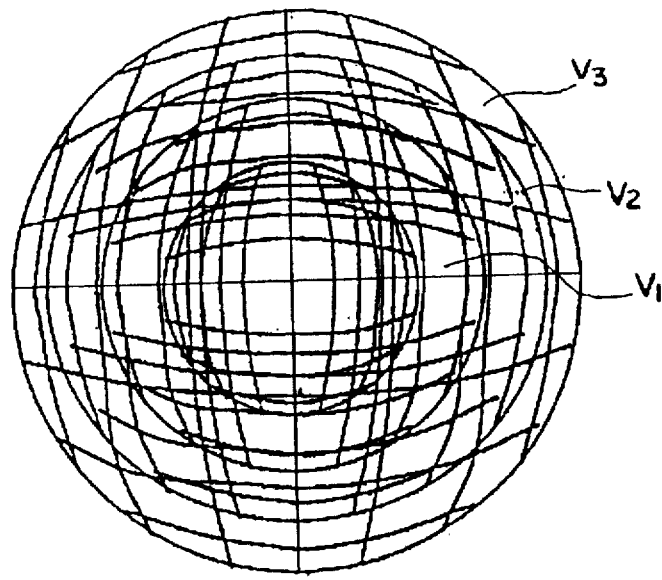
FIG. 20 is a diagram showing a spherical construction of the three-dimensional display device formed of a stacking of shells each forming a two-dimensional display device.

FIG. 20 shows an example of a full-color three-dimensional display device formed by the construction of FIG. 19.

Referring to FIG. 20, the display device is formed of a stacking of full-color display shells $V_1$, device from an exterior of the device.

Figure 21:
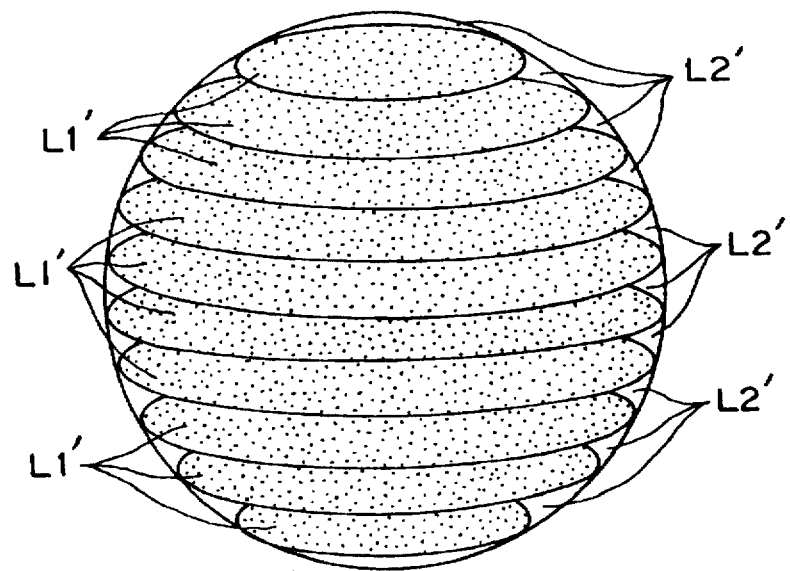
FIG. 21 is a diagram showing a spherical construction of the three-dimensional display device formed by stacking a number of disks each forming a two-dimensional display device.

FIG. 21 shows another example of the three-dimensional display device having a spherical surface.

In the example of FIG. 21, a number of disk-shaped display layers having various diameters are stacked to form a spherical body, wherein each of the disk shaped display layers has a layered structure of FIG. 14 and includes a layer $L_1'$ corresponding to the driver layer $L_1$ and a layer $L_2'$ corresponding to the display layer $L_2$. As each display layer is transparent in such a construction, it is possible to recognize the information interior of the display device from an exterior.

Figure 22:
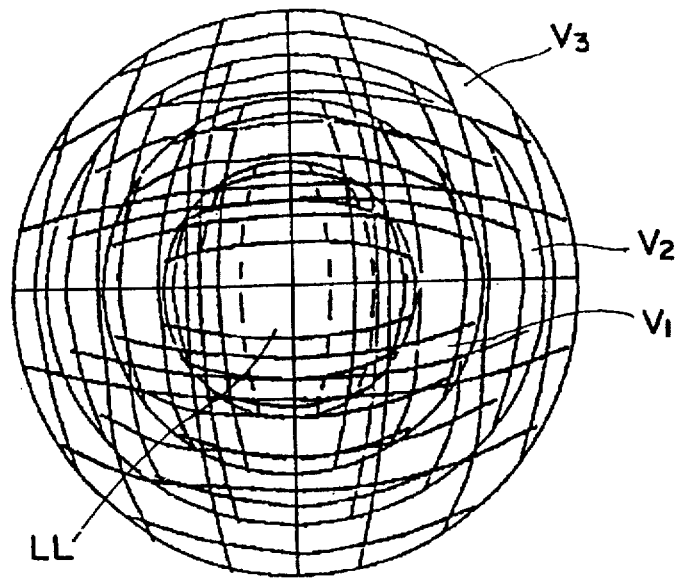
FIG. 22 is a diagram showing the display device of FIG. 20 in which a central back light is provided.

FIG. 22 shows a modification of the three-dimensional display device of FIG. 20. In the example of FIG. 22, there is formed a hollow space at the center of the spherical body that forms the display device, and a spherical back light LL is provided in such a hollow central space. Such a spherical back light LL may be formed by arranging an LED array on a spherical surface.

Figure 23:
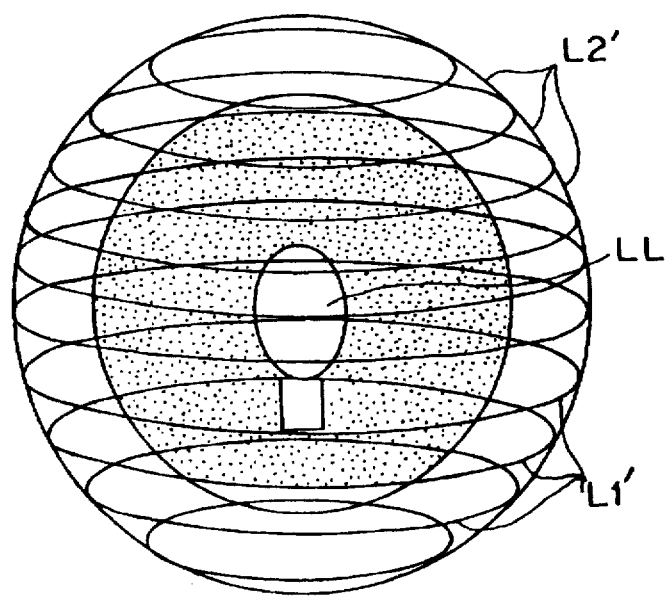
FIG. 23 is a diagram showing the display device of FIG. 21 in which a central back light is provided.

FIG. 23 shows a modification of the three-dimensional display device of FIG. 21. In the example of FIG. 23, too, a hollow space is formed at the center of the display device and a spherical back light LL is accommodated in such a central hollow space for back light illumination.

Figure 24:
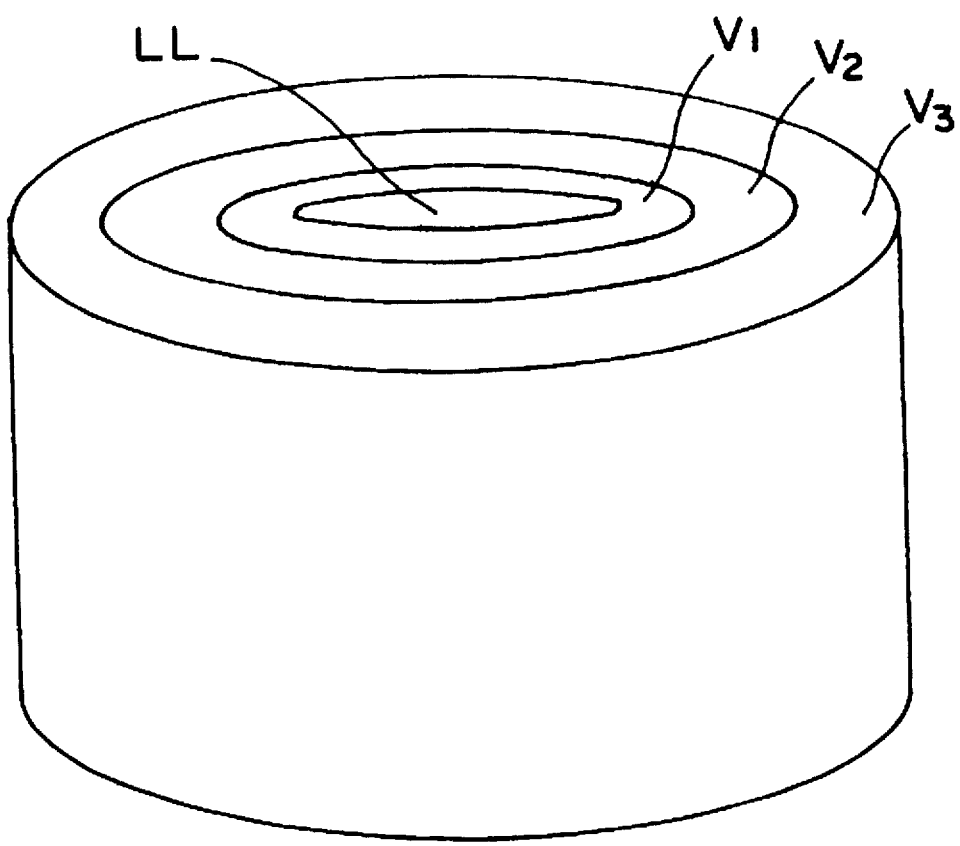
FIG. 24 is a diagram showing a cylindrical construction of the three-dimensional display device formed by stacking a number of sleeves each forming a two-dimensional display device.

FIG. 24 shows a full-color three-dimensional display device having a cylindrical surface, wherein the full-color display device is constructed based upon the construction of FIG. 19.

Referring to FIG. 24, it will be noted that the display device includes cylindrical display layers $V_1'$, $V_2'$, $V_3'$ corresponding to the display layers $V_1, V_2, V_3, \ldots$ that form a spherical shell, wherein the layers $V_1', V_2', V_3', \ldots$ are stacked coaxially to form a cylindrical body. Further, a tubular back light LL is disposed at the hollow space at the center of the cylindrical body thus formed. In such a construction, too, it is possible to recognize the information interior to the display device from an exterior thereof.

As described heretofore, the display device of the present invention can construct the driver circuit to be optically transparent by using a transparent device such as a dielectric base transistor for the active device. Thereby, no interruption of the back light occurs by the driver circuit. Further, there is no need to provide an optical shield to the driver circuit. This in turn means that there is no need to reduce the area of the active device in the driver circuit, and it is possible to provide additional circuit such as a redundancy circuit in the driver circuit without inviting decrease in the amount of light passing through the display device.

Figure 25:
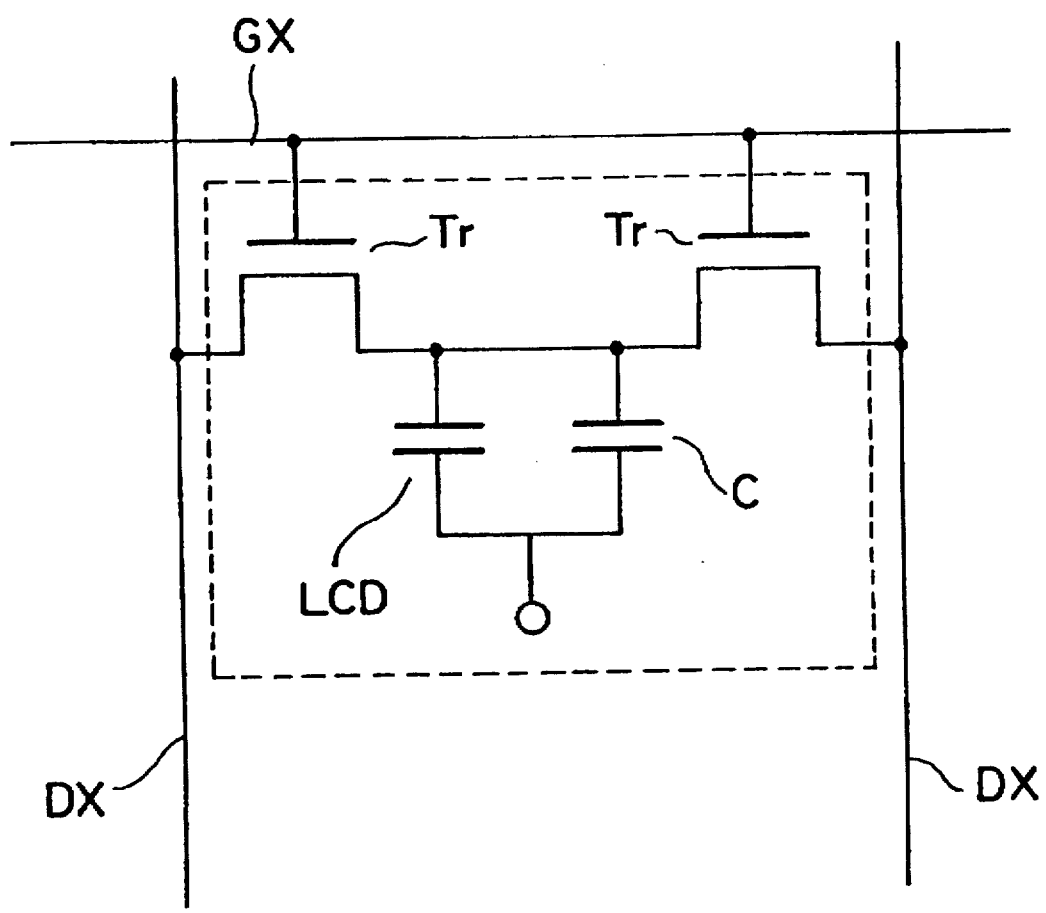
FIG. 25 is a circuit diagram showing an example of redundant driver circuit constructed from transparent dielectric base transistor.

FIG. 25 shows an example of the driver circuit that includes such a redundant circuit.

Referring to FIG. 25, the driver circuit includes an additional dielectric base transistor Tr' in addition to the dielectric base transistor Tr described previously, wherein the transistor Tr and the transistor Tr' respectively supply the voltage signal on the data line DX and the voltage signal on a redundant data line DX' to the liquid crystal device LCD and the stabilization capacitor C in response to the signal on the gate line GX. As the transistors Tr and Tr' are transparent to the visible lights, it is possible to provide redundancy in the driver circuit, without sacrificing the luminance of the display device.

Further, the present invention is by no means limited to the embodiments described heretofore, but various variations and modifications may be made without departing from the scope of the invention.

What is claimed is:

1. A display device for visually displaying information, comprising:

an optically transparent substrate;

an optically transparent driver circuit provided on said substrate; and a display element provided on said driver circuit in electrical connection therewith, said display element causing a change in optical state in response to a drive supplied from said driver circuit, wherein said driver circuit comprises a transistor having an active part formed of an optically transparent dielectric material, wherein said driver circuit is provided so as to overlap with said display element when viewed in a direction perpendicular to said substrate.

2. A display device as claimed in claim 1, wherein said driver circuit comprises a dielectric base transistor, said dielectric base transistor comprising:

a dielectric base including an optically transparent first dielectric layer having a first dielectric constant, and an optically transparent second dielectric layer having a second dielectric constant that is smaller than said first dielectric constant and provided on said first dielectric layer;

an emitter electrode formed of an optically transparent material and provided on said second dielectric layer forming said dielectric base;

a collector electrode formed of an optically transparent material and provided on said second dielectric layer forming said dielectric base; and a base electrode formed of an optically transparent material and provided on said dielectric base in electrical connection with said first dielectric layer.

3. A display device as claimed in claim 2, wherein said emitter electrode is connected to said display element electrically.

4. A display device as claimed in claim 2, wherein said dielectric base transistor includes a base electrode layer of a transparent conductor formed on a surface of said substrate in electrical connection with said base electrode;

said dielectric base is formed on said base electrode layer; and wherein said emitter electrode and said collector electrode are provided on said first dielectric layer forming said dielectric base.

5. A display device as claimed in claim 2, wherein said dielectric base transistor includes a collector electrode layer of a transparent conductor provided on a surface of said substrate in electrical connection with said collector electrode;

said dielectric base is provided on said collector electrode;

said base electrode is provided on said second dielectric layer forming said dielectric base; and wherein said collector layer is formed on said first dielectric layer forming said dielectric base.

6. A display device as claimed in claim 1, wherein said display element comprises a light emitting element that emits a light in response to said drive signal.

7. A display device as claimed in claim 1, wherein said display device comprises a liquid crystal device that interrupts a transmission of light passing therethrough in response to said drive signal.

8. A display device as claimed in claim 7, wherein said liquid crystal device comprises:

a first electrode connected to said driver circuit;

a second electrode provided above said first electrode with a separation therefrom;

a liquid crystal layer held between said first and second electrodes;

a first molecular alignment film provided on said first electrode for causing a molecular alignment in said liquid crystal layer; and a second molecular alignment film provided on said second electrode for causing a molecular alignment in said liquid crystal layer.

9. A display device as claimed in claim 8, wherein said first electrode comprises a plurality of electrode elements disposed in rows and columns and forming a first group electrode elements;

wherein said second electrode comprises a plurality of electrode elements disposed in rows and columns in correspondence to said first group electrode elements and forming a second group electrode elements, each of said second group electrode elements facing a corresponding first group electrode element, each of said first group elements and a corresponding second group element thereby defining a pixel; and wherein said drive circuit comprises a dielectric base transistor, said dielectric base transistor having a base of a dielectric material and being provided in correspondence to each of said pixels.

10. A display device for visually displaying information, comprising:

a plurality of display panels stacked with each other, each of said plurality of display panels comprising: an optically transparent substrate; an optically transparent driver circuit provided on said substrate; and a display element provided on said driver circuit in electrical connection therewith, said display element causing a change in optical state in response to a drive signal supplied from said driver circuit, wherein, in each of said plurality of panels, said display element comprises a liquid crystal device, said liquid crystal device comprising: a first electrode connected to said driver circuit; a second electrode provided above said first electrode with a separation therefrom so as to face said first electrode; a liquid crystal layer held between said first and second electrodes; a first molecular alignment film provided on said first electrode; and a second molecular alignment film provided on said second electrode;

said first electrode comprising a plurality of electrode elements disposed in rows and columns and forming a first group of electrode elements;

said second electrode comprising a plurality of electrode elements disposed in rows and columns and forming a second group of electrode elements, each of said second group of electrode elements facing a corresponding electrode element of said first group, each electrode element of said first group and a corresponding electrode element of said second group defining a pixel; and wherein said driver circuit comprises a plurality of dielectric base transistors each provided in correspondence to a pixel, each of said dielectric base transistors having a dielectric base that includes a stacking of dielectric layers.

11. A display device as claimed in claim 9, wherein said plurality of panels includes a first panel corresponding to a first color of the three primary colors, a second panel provided on said first panel and corresponding to a second color of the three primary colors, a third panel provided on said second panel and corresponding to a third color of the three primary colors, and a filter plate provided on the third panel;

wherein said filter plate includes: a first filter element provided in correspondence to said first and second group electrode elements for selectively passing a light of said first primary color; a second filter element provided in correspondence to said first and second group electrode elements for passing a of said second primary color; and a third filter element provided in correspondence to said first and second group electrode elements for selectively passing a light of said third primary color.

12. A display device as claimed in claim 10, wherein said display device further includes a planar light source disposed below a stack of said display panels.

13. A display device as claimed in claim 10, wherein each of said plurality of panels includes a plurality of optically transparent substrate elements, said substrate elements being connected with each other with an angle such that said plurality of substrate elements define a curved surface.

14. A display device as claimed in claim 10, wherein each of said plurality of panels forms a spherical shell such that said plurality of panels form a spherical body as a result of stacking.

15. A display device as claimed in claim 14, wherein said spherical body has a hollow space at a central part thereof, and wherein said display device further includes a light source accommodated in said hollow space.

16. A display device as claimed in claim 10, wherein said plurality of panels have a disk shape having a diameter that changes disk by disk, said plurality of disks being stacked to form a spherical body.

17. A display device as claimed in claim 10, wherein each of said plurality of panels has a form of cylindrical shell and wherein said cylindrical shells are stacked coaxially with each other to form said display device.

18. A display device as claimed in claim 2, wherein said driver circuit includes an additional dielectric base transistor forming a redundant circuit.

* * * * *